(12) United States Patent
Gronenborn (10) Patent No.: US 12,235,360 B2
(45) Date of Patent: Feb. 25, 2025

(54) LASER ARRANGEMENT WITH OPTICAL FILTER

(71) Applicant: TRUMPF Photonic Components GmbH, Ulm (DE)

(72) Inventor: Stephan Gronenborn, Ulm (DE)

(73) Assignee: TRUMPF PHOTONIC COMPONENTS GMBH, Ulm (DE)

(*) Notice: Subject to any disclaimer, the term of this patent is extended or adjusted under 35 U.S.C. 154(b) by 946 days.

(21) Appl. No.: 16/919,135

(22) Filed: Jul. 2, 2020

(65) Prior Publication Data

US 2020/0333445 A1     Oct. 22, 2020

Related U.S. Application Data

(63) Continuation of application No. PCT/EP2018/086903, filed on Dec. 31, 2018.

(30) Foreign Application Priority Data

Jan. 5, 2018 (EP) .................................... 18150431

(51) Int. Cl.
   *G01S 17/10*     (2020.01)
   *G01S 7/481*     (2006.01)
   (Continued)

(52) U.S. Cl.
   CPC ............. *G01S 17/10* (2013.01); *G01S 7/4811* (2013.01); *G01S 7/4815* (2013.01); *G01S 17/894* (2020.01); *H01S 5/423* (2013.01)

(58) Field of Classification Search
   CPC .... G01S 7/4811; G01S 7/4814; G01S 7/4815; G01S 7/4816; G01S 7/484; G01S 7/486;
   (Continued)

(56) References Cited

U.S. PATENT DOCUMENTS 5,960,024 A * 9/1999 Li .......................... H01S 5/423
                                                    372/96
5,974,071 A   10/1999 Jiang et al.
(Continued)

FOREIGN PATENT DOCUMENTS

EP    3176888 A1 *  6/2017
GB    2374201 A     10/2002
(Continued)

OTHER PUBLICATIONS

Moench, et al., "VCSEL-based Sensors for Distance and Velocity," *Proceedings of the SPIE* 9766: 97660A-97660A (Mar. 4, 2016). XP060066637.

*Primary Examiner* — Yuqing Xiao
*Assistant Examiner* — Benjamin Richard Hebert
(74) *Attorney, Agent, or Firm* — LEYDIG, VOIT & MAYER, LTD.

(57) ABSTRACT

A laser arrangement for time-of-flight measurements includes an optical filter adjacent to a laser. The laser and optical filter each have a substrate and an active layer arranged between a first and second mirror. The laser emits laser light in a first direction through its first mirror. The optical filter receives the laser light reflected from an object through its first mirror. The laser's and the optical filter's first mirrors have an equal reflectivity. The laser's and the optical filter's second mirrors have an equal reflectivity, or the reflectivity of the optical filter's second mirror is reduced with respect to that of the laser. The optical filter filters the received light such that laser light reflected from the object and received from the first direction passes the optical filter.

16 Claims, 5 Drawing Sheets

(51) Int. Cl.
*G01S 17/894* (2020.01)
*H01S 5/42* (2006.01)

(58) Field of Classification Search
CPC ........ G01S 17/003; G01S 17/10; G01S 17/14; G01S 17/18; G01S 17/894; H01S 5/183; H01S 5/423
See application file for complete search history.

(56) References Cited

U.S. PATENT DOCUMENTS

| | | | |
|---|---|---|---|
| 5,978,401 A * | 11/1999 | Morgan | H01S 5/0262 398/115 |
| 9,705,283 B1 | 7/2017 | Deppe et al. | |
| 2005/0200832 A1 * | 9/2005 | Kawai | G01S 7/4868 356/5.03 |
| 2007/0133642 A1 | 6/2007 | Park et al. | |
| 2007/0181810 A1 | 8/2007 | Tan et al. | |
| 2008/0094605 A1 | 4/2008 | Drodofsky et al. | |
| 2008/0291953 A1 * | 11/2008 | Gilet | H01S 5/0264 372/29.01 |
| 2010/0027104 A1 * | 2/2010 | Esener | G02F 3/02 359/344 |
| 2010/0328680 A1 * | 12/2010 | Moench | G01S 7/4916 356/615 |
| 2015/0219764 A1 | 8/2015 | Lipson | |
| 2015/0340841 A1 * | 11/2015 | Joseph | H01S 5/04257 372/50.12 |
| 2015/0362585 A1 | 12/2015 | Ghosh et al. | |
| 2016/0227194 A1 * | 8/2016 | Kim | H04N 13/257 |
| 2016/0266242 A1 * | 9/2016 | Gilliland | G01S 7/4863 |
| 2017/0090032 A1 | 3/2017 | Ridderbusch | |
| 2017/0102461 A1 | 4/2017 | Iida et al. | |

FOREIGN PATENT DOCUMENTS

| | | |
|---|---|---|
| GB | 2518454 A | 3/2015 |
| WO | 2014018684 A1 | 1/2014 |
| WO | 2015189025 A1 | 12/2015 |

* cited by examiner

LASER ARRANGEMENT WITH OPTICAL FILTER

CROSS-REFERENCE TO PRIOR APPLICATIONS

This application is a continuation of International Patent Application No. PCT/EP2018/086903, filed on Dec. 31, 2018, which claims priority to European Patent Application No. EP 18150431.7, filed on Jan. 5, 2018. The entire disclosure of both applications is hereby incorporated by reference herein.

FIELD

The present invention relates to a laser arrangement with optical filter for time-of-flight measurements, a detector arrangement for time-of-flight measurements, a time-of-flight camera, a method of determining a depth image, and a corresponding computer program product.

BACKGROUND

Laser arrangements comprising, for example, a Vertical Cavity Surface Emitting Laser (VCSEL) array can be used for infrared illumination devices. Using short pulses, VCSEL arrays are, for example, applied in time-of-flight applications. Such applications comprise, e.g. short-range gesture recognition for portable devices and 3D space recognition. VCSEL arrays of about 1 mm² area with output power in the 1-10 W range are discussed for such applications. A specific field of illumination or view is defined by the application (e.g., a time-of-flight camera observing e.g. 70°×50°.

EP 3 176 888 A1 discloses a sensor chip suited for time-of-flight measurements. The sensor chip comprises one or more lasers and photodetectors, which are arranged next to each other on the same semiconductor substrate. The lasers or laser structures and photodetectors or photodetector structures are processed on the same wafer in the same processing steps. The variations between the structures of the lasers and the photodetectors can therefore be minimized. The resonant photodetectors are arranged to be sensitive in the wavelength range in which the lasers emit laser light. The optical passband of the resonant photodetectors is broader than the optical passband of a laser cavity of the lasers. Variations of the emission wavelengths of the laser light, which may, for example, be caused by temperature differences between the light emitting laser and the resonant photodetector can therefore be compensated.

SUMMARY

In an embodiment, the present invention provides a laser arrangement for time-of-flight measurements that includes an optical filter adjacent to a laser. The laser and optical filter each have a substrate and an active layer arranged between a first and second mirror. The laser emits laser light in a first direction through its first mirror. The optical filter receives the laser light reflected from an object through its first mirror. The laser's and the optical filter's first mirrors have an equal reflectivity. The laser's and the optical filter's second mirrors have an equal reflectivity, or the reflectivity of the optical filter's second mirror is reduced with respect to that of the laser. The optical filter filters the received light such that laser light reflected from the object and received from the first direction passes the optical filter.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Embodiments of the present invention provide an improved laser arrangement for time-of-flight measurements.

According to a first aspect of the present disclosure, a laser arrangement for time-of-flight measurements is provided. The laser arrangement comprises at least one laser and at least one optical filter arranged adjacent to the at least one laser. The at least one laser and the at least one optical filter each comprise a substrate, a first mirror, a second mirror, and an active layer arranged between the first mirror and the second mirror. The at least one laser is arranged to emit laser light in a first direction. The optical filter is arranged to receive received light. The received light comprises laser light reflected from an object. The laser light is emitted through the first mirror of the at least one laser and the received light is received through the first mirror of the at least one optical filter. The first mirror of the at least one laser and the first mirror of the at least one optical filter have an equal reflectivity. The second mirror of the at least one laser and the second mirror of the at least one optical filter have an equal reflectivity or the reflectivity of the second mirror of the at least one optical filter is reduced with respect to the reflectivity of the second mirror of the at least one laser. The optical filter is further arranged to filter the received light such that laser light reflected from the object and received from the first direction passes the optical filter.

The at least one laser and the at least one optical filter may be arranged side by side. The at least one laser may preferably be arranged to emit laser light of the wavelengths for which the substrate is transparent. The wavelength of the emitted laser light may, for example, be longer than around 900 nm in case of a GaAs substrate (depending on the thickness of the substrate). The substrate may alternatively or in addition be removed such that reflected laser light can enter the optical filter via the first mirror and at least a part of the reflected laser light filtered by the optical filter can leave the optical filter via the second mirror (or vice versa). Laser and optical filter are characterized by a semiconductor epitaxial layer stack comprising amongst others the first mirror, the second mirror and the active layer. The first mirror, the second mirror and the active layer may be characterized by the same optical characteristics. Laser and optical filter are therefore preferably processed in the same production process in order to avoid or at least limit the influence of production spread. The semiconductor layer stack is (essentially) the same for both devices. The optical filter is therefore arranged such that the filter wavelength matches during operation the emission wavelength of the laser. Laser and optical filter are thermally coupled in a way such that the temperatures of the laser and the optical filter during operation of the laser arrangement are essentially the same in order to compensate for thermal shift of the emission wavelength of the laser. The laser arrangement is therefore arranged to emit laser light in the first direction and receive reflected laser light from the same first direction such that the optical filter suppresses ambient light with different wavelength and/or direction of reception. The laser arrangement therefore enables a very sensitive detector arrangement.

The substrate may be a common substrate, wherein the at least one laser and the optical filter are arranged on the common substrate. The at least one laser is a Vertical Cavity Surface Emitting Laser (VCSEL). VCSELs can be processed in parallel such that neighboring VCSEL structures share the same epitaxial layer stack. The first VCSEL structure of two neighboring VCSEL structures may be used as laser, and a second VCSEL structure of the two neighboring VCSEL structures may be used as optical filter.

VCSEL arrays have a laser wavelength spread of about 10-20 nm and a thermal shift of the wavelength of 0.07 nm/K, resulting in another 10 nm spread for, e.g., automotive conditions from −40° C. to 105° C. Using two (or more) neighboring VCSEL devices therefore enables compensation of production spread, and because of the strong thermal coupling, avoids or at least reduces thermal drift and different temperatures of both VCSEL devices.

The first and the second mirror are optimized for laser operation towards one side, which can be the substrate side or the epitaxial site (bottom emitter or top emitter). One of the mirrors (Distributed Bragg Reflectors-DBR) may be characterized by a high reflectivity >99.9% and the other one, through which the light is emitted, by a somewhat lower reflectivity of about 99.5%. Reflectivity of the DBR with higher reflectivity may be reduced (e.g., by etching or providing additional layers) for the VCSEL structure building the optical filter such that both DBRs are characterized by the same reflectivity (e.g., 99.5%). The same reflectivity of the first and the second DBR (or more generally first or second mirror) enables an optimized transmission of the optical filter for the intended filter wavelength (emission wavelength of the neighboring VCSEL structure building the laser) received from the first direction.

The reflectivity of the first and the second DBR may, according to an alternative embodiment, be lowered (e.g., between 95% and 99.5%) such that only gain-switching operation of the laser is enabled. Such a design would enable a higher transmission through the neighboring optical filter at the same time.

The at least one laser and the at least one optical filter may be arranged to receive a common drive current. The at least one laser is in this embodiment characterized by a first threshold current. The at least one optical filter is characterized by a second threshold current higher than the first threshold current. The at least one laser and the at least one optical filter may, for example, share common electrodes. Providing different threshold currents (e.g., by different diameters of the corresponding VCSEL structure) enables emission of laser light by means of the VCSEL structure (laser) with the lower threshold current (electrical pumping above the laser threshold) and high transparency of the VCSEL structure (optical filter) with the higher threshold current (electrical pumping below the threshold). The laser and the optical filter can therefore be driven by the same drive current. Local heating of the laser and the optical filter are therefore very similar.

The laser arrangement may further comprise at least a second laser and at least a second optical filter. Each laser and each optical filter is optically coupled with an optical device. The optical device is arranged such that laser light emitted by the second laser is emitted in a second direction different than the first direction. The optical device is further arranged to receive received light. The received light comprises reflected laser light emitted by the second laser. The second optical filter is further arranged to filter the received light such that reflected laser light received from the second direction passes the second optical filter. The optical device enables angular selective emission and reception of the laser light. Two, three, four, or more pairs of lasers and corresponding optical filters may be arranged to emit laser light in different directions and receive reflected laser light from the respective direction such that the reflected laser light can pass the corresponding optical filter. One or more subgroup of the pairs of lasers and corresponding optical filters may be arranged to emit laser light in the same direction and receive reflected laser light from this direction such that the reflected laser light received from this direction can pass the optical filters of the respective subgroup. The optical device may be a common optical device or each laser and each optical filter may be coupled to a separate optical device.

According to a further aspect of the present disclosure, a detector arrangement for time-of-flight measurements is provided. The detector arrangement may be a time-of-flight detector module. The detector arrangement comprises at least one laser, at least one optical filter, at least one carrier structure, and at least one first driver. The at least one laser and the at least one optical filter comprise a substrate, a first mirror, a second mirror, and an active layer arranged between the first mirror and the second mirror. The at least one laser is arranged to emit laser light in a first direction. The optical filter is arranged to receive received light. The received light comprises laser light reflected from an object. The laser light is emitted through the first mirror of the at least one laser and the received light is received through the first mirror of the at least one optical filter. The first mirror of the at least one laser and the first mirror of the at least one optical filter have an equal reflectivity. The second mirror of the at least one laser and the second mirror of the at least one optical filter have an equal reflectivity or the reflectivity of the second mirror of the at least one optical filter is reduced with respect to the reflectivity of the second mirror of the at least one laser. The object is arranged in a predefined detection range. The optical filter is further arranged to filter the received light such that laser light reflected from the object and received from the first direction passes the optical filter. The at least one laser and the at least one optical filter are attached to the carrier structure. The carrier structure comprises at least one optical sensor. The at least one optical sensor is arranged to detect the received light filtered by the optical filter. The first driver is arranged to control the at least one laser such that laser light of a predetermined pulse length is emitted. The predetermined pulse length is shorter than 20 ns, preferably shorter than 10 ns. The predetermined pulse length is shorter than a time period for receiving laser light reflected from the object in the predefined detection range.

A detector arrangement comprising a laser and a separate optical filter (laser arrangement described above) may be electrically driven such that longer laser pulses may be emitted (longer than the time period for receiving the light reflected from the object. A detector arrangement comprising such a laser arrangement may therefore not be bound to the limitation with respect to first driver. The first driver may in this case be arranged such that laser light of a predetermined pulse length is emitted. The predetermined pulse length may in this case comprise any pulse length, which is suited to provide a reliable time-of-flight measurement.

The at least one laser and the at least one optical filter may comprise the same physical structure. This means that the physical structure acts in the first moment in time as a laser and in a second different moment in time as an optical filter.

The laser and the optical filter may be arranged on a first chip, which is mounted on the carrier structure (second chip). Optionally, a transparent spacer may be implemented between the two chips (can be a Si chip with vias for electrical connection) to further decrease the amount of amplified spontaneous emission (ASE) emitted from the optical filter to the optical sensor as the ASE is emitted in all directions while the filtered (and/or amplified see below) received light is perpendicular to the epitaxial layer structure of the laser.

The optical sensor may be arranged to provide a nonlinear response upon detection of the received light. The nonlinear response may enable detection of very low optical intensities resulting from the received light. The optical sensor may, for example, comprise a single photon avalanche diode (SPAD), which is well-suited to detect time-of-flight signals.

The carrier structure may further comprise at least the first driver arranged to provide a drive current at least to the at least one laser. Integration of the first driver may enable a very compact design.

The substrate may be a common substrate. The at least one laser and the optical filter are arranged adjacent to each other on the common substrate. The at least one laser is a VCSEL. The optical filter may be a VCSEL structure being identical with the corresponding VCSEL or sharing essentially the same epitaxial layer structure as the VCSEL. Using one common substrate enables the advantages with respect to the thermal coupling and production spread as discussed above.

The at least one laser may be characterized by a first threshold current. The at least one optical filter is in this embodiment characterized by a second threshold current higher than the first threshold current. The first driver is arranged to provide a first drive current to the at least one laser and the at least one optical filter. The first drive current is arranged between the first threshold current and the second threshold current. The at least one optical filter may, for example, be a VCSEL with an active area (area of the active layer receiving the drive current as defined, for example, by a corresponding current confinement structure (e.g. oxide aperture)) which is bigger than an active area of the at least one laser. The optical filter and the first drive current may be arranged to amplify reflected laser light received from the object. The first drive current may, for example, be slightly below the second threshold current to enable amplification. Reflected light initiates lasing of the optical filter and the light of the optical filter is detected. The first current may be a common (pulsed) drive current, which is provided simultaneously to the lasers and the optical filters (series circuit of laser(s) and optical filter(s)). There may be two separate drivers in case of different series resistance of laser and optical filter.

The first driver may in an alternative embodiment be arranged to provide a first drive current higher than the first threshold current to the at least one laser. The first driver or a second driver may be further arranged to provide a second drive current smaller than the first threshold current to the at least one optical filter. The at least one laser and the optical filter may optionally be characterized by the same first threshold current. The second drive current may be used to provide sufficient transparency of the optical filter.

The second drive current through the optical filter may optionally be increased to slightly below laser threshold, such that the active layer in the optical filter acts as amplifier for the reflected laser light comprised by the received light of correct wavelength and reception angle.

The second drive current, may, for example, enable lasing of the optical filter upon reception of reflected laser light. In this embodiment the DBR may remain unetched (reflectivity of the first and the second mirror is not the same). Amplification of the received laser light may provide sufficient light for the optical sensor, which will be coupled off the high-reflectivity side of the DBR towards the optical sensor. Use of independent first and second drive currents may therefore increase flexibility and performance (especially sensitivity) of the detector arrangement.

The optical filter (and the laser) may further comprise a phototransistor (PT) or more specifically distributed heterojunction bipolar phototransistor (HPT). The HPT comprises a collector layer, a light sensitive layer, a base layer, and an emitter layer. The HPT is arranged such that there is an optical coupling between the active layer and the HPT for providing an active carrier confinement by means of the HPT. The phototransistor may be used to start lasing of the optical filter by increasing current in reaction to absorption of reflected laser light. The phototransistor may be integrated in the optical resonator build by the two mirrors and the embedded active layer. The phototransistor may preferably be positioned near to the active layer (e.g., between the active layer and one of the mirrors).

The at least one laser may, according to another embodiment, be characterized by a first threshold current. The first driver is arranged to provide a first drive current above the first threshold current for the predetermined pulse length. The first driver or a second driver is arranged to provide a second drive current below the first threshold current to the optical filter during detection of laser light reflected from the object in the predefined detection range. The first driver may, for example, be arranged to provide the first drive current to the laser and optionally to the optical filter (different threshold current of the laser and the optical filter) in a first time period and the second drive current to the optical filter and optionally to the laser (second drive current has to be below laser threshold of the laser) in a second subsequent time. The first driver may alternatively be arranged to provide the first drive current to the laser, and the second driver may either permanently or for a predetermined time period after the predetermined pulse length provide the second drive current to the optical filter. Providing the second drive current to the optical filter for predetermined time period enables temporal and therefore spatial filtering (predefined range of distances in view of light speed) of the detection of reflected laser light. The optical filter is transparent or amplifies the reflected laser light only during the predetermined time period.

The detector arrangement may further comprise at least a second laser and at least a second optical filter. Each laser and each optical filter is optically coupled with an optical device. The optical device is arranged such that laser light emitted by the second laser is emitted in a second direction different than the first direction. The optical device is further arranged to receive received light. The received light comprises reflected laser light emitted by the second laser. The second optical filter is further arranged to filter the received light such that reflected laser light emitted by the second laser and received from the second direction passes the second optical filter. The optical device enables angular selective emission and reception of the laser light as described above. Two, three, four, or more pairs of lasers and corresponding optical filters may be arranged to emit laser light in different directions and receive reflected laser light from the respective direction such that the reflected laser light can pass the corresponding optical filter.

According to the third aspect of the present disclosure, a time-of-flight camera is provided. The time-of-flight camera comprises the detector arrangement according to any embodiment described above. The time-of-flight camera further comprises an evaluator. The evaluator is arranged to determine a distance to the object by means of detection of received light.

According to a fourth aspect of the present disclosure, a method of determining a depth image of a scene is provided. The method uses the time-of-flight camera according to the third aspect, and comprises the steps of:

emitting laser light in a multitude of different directions, wherein at least one laser emits laser light in at least one of the multitude of directions, filtering received light comprising laser light reflected by an object in the scene for each of the multitude of directions by means of at least one optical filter for each direction, wherein at least one optical filter is associated with the at least one laser emitting laser light in the corresponding direction, wherein each optical filter comprises an optical passband in the wavelength range of the laser light for the corresponding direction, detecting the filtered received light by means of at least one optical sensor for each optical filter, and determining distances to the object by means of a time of emission of the laser light and a time of detection of the filtered received light.

The depth image of the scene may be reconstructed based on the determined distances.

The method may be further characterized in that:

the step of emitting laser light comprises the step of providing a drive current above a first threshold current of the lasers to the lasers, and the step of filtering received light comprises the step of providing a heating current below a second threshold current of the optical filters to the optical filters.

The heating current is arranged to match the temperature of the optical filters to the temperature of the lasers. The heating current is below a potential laser threshold current of the optical filters. The heating current further increases transparency and may enable amplification of the received laser light for the corresponding direction as discussed above.

The drive current and the heating current may be characterized by the same current strength if the first threshold is lower than the second threshold as discussed above.

According to a fifth aspect of the present disclosure, a computer program product is provided. The computer program product comprises code means, which can be saved on at least one memory device comprised by the time-of-flight camera described above. The code means are arranged such that the method described above can be executed by means of at least one processing device comprised by the time-of-flight camera.

The memory device or the processing device may be comprised by the time-of-flight camera (e.g. electrical driver, controller etc.)

The memory device or devices may be any physical device being arranged to store information especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

It shall be understood that the method described above and the time-of-flight camera described above have similar and/or identical embodiments.

These and other aspects of present the invention will be apparent from and elucidated with reference to the embodiments described hereinafter.

The present invention will now be described, by way of example, based on exemplary embodiments with reference to the accompanying drawings.

In the Figures, like numbers refer to like objects throughout. Objects in the Figures are not necessarily drawn to scale.

Figure 1:
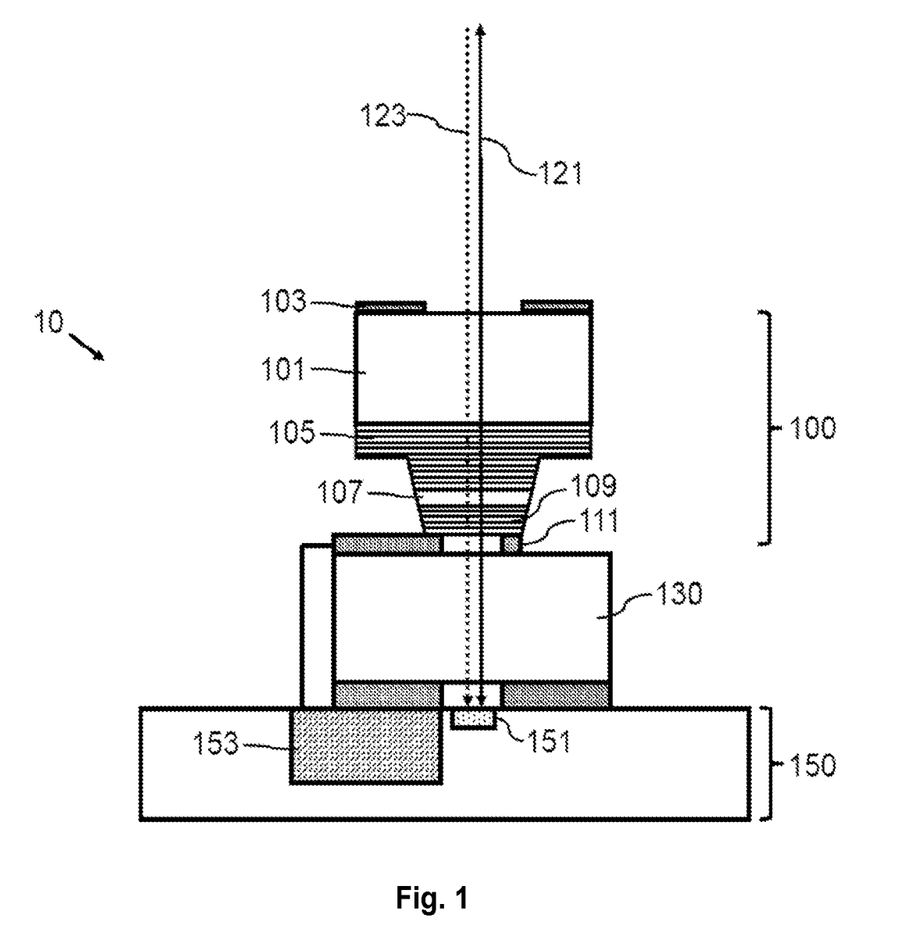
FIG. 1 shows a first detector arrangement.

FIG. 1 shows a principal sketch of a first detector arrangement 10 for time-of-flight measurements. The detector arrangement 10 comprises a laser arrangement 100 and a carrier structure 150. The laser arrangement 10 comprises, in this embodiment, a bottom emitting VCSEL comprising an optical resonator with a first mirror 105 (first DBR), a second mirror 109 (second DBR), and an active layer 107 sandwiched between the first DBR and the second DBR. The active layer 107 typically comprises one or several quantum well layers. The layers of the first DBR are deposited on a substrate 101 (GaAs-substrate). Reflectivity of the first DBR is somewhat lower (e.g. reflectivity of 99.5%) than reflectivity of the second DBR (e.g. reflectivity >99.9%). A first electrical contact 103 (usually n-contact) is provided on a backside of the substrate 101 opposing the side of the substrate 101 on which the optical resonator is provided. A second electrical contact 111 (usually p-contact) is provided on top of the second DBR. The first and the second electrical contact 103, 111 are arranged to provide an electrical drive current (electrically pump) the optical resonator. The VCSEL may comprise further layers as, for example, current distribution layers, current confinement layers, and the like. The first electrical contact 103 as well as the second electrical contact 111 (both may comprise metal layers) may surround a hole through which laser light 121 can be emitted if a drive current above a laser threshold current of the laser arrangement 100 is supplied. Emission wavelength of the laser light 121 is above 900 nm, preferably above 930 nm, such that the substrate 101 is essentially transparent for laser light 121. The laser arrangement 101 is mounted with the second electrode 111 on top of a spacer 130, which consists, in this embodiment, out of material that is transparent for laser light 121. The spacer 130 is arranged to provide electrical connection of the first electrode 103 and the second electrode 111. The spacer 130 is mounted on the carrier structure 150 which comprises a first driver which is arranged to provide the drive current to the VCSEL. The carrier structure 150 further comprises an optical sensor 151. The optical sensor 151 may, for example, be a single photon avalanche diode which is integrated in the carrier structure and which is aligned with the openings of the first electrical contact 103 and the second electrical contact 111.

Most of the laser light 121 is emitted through the first DBR in a first direction, but a small part is emitted via the second DBR such that the optical sensor 151 receives laser light 121 emitted by the VCSEL. The optical sensor 151 is therefore arranged to detect an emission time of laser light 121 emitted by the VCSEL. A part of the laser light 121 emitted through the substrate 101 may be reflected by an object. Received light 123, comprising reflected laser light 121 received from the first direction, enters the optical resonator through the substrate 101. The received light 123 is received after a predetermined pulse length of the laser light 121. The first driver 153 is therefore arranged to lower the drive current below the laser threshold of the VCSEL after the predetermined time period. The first driver 153 is further arranged to provide a subsequent or second drive current to the VCSEL, which is slightly below the laser threshold of the VCSEL. The second drive current may be provided as soon as the laser starts lasing or during a predetermined time period starting later than reduction of the drive current below laser threshold. The second drive current enables amplification of the received light 123, which is received from the same direction in which the laser emitted the laser light 121. The received light 123 is filtered by means of the layer stack of the optical resonator (and the substrate 101) such that essentially no ambient light reaches the active layer 107. The VCSEL may optionally start lasing upon reception of the received light 123 as long as the second drive current is applied. The filtered received light 123 or the laser pulse (amplified received light 123) is detected by means of the optical sensor 151. Amplification (laser pulse) may especially advantageous in view of the high reflectivity of the second DBR. The detector arrangement 10 is therefore arranged to determine the time-of-flight of laser light 121 emitted in the first direction. The spacer, which is arranged between the VCSEL and the carrier structure 150, decreases the amount of amplified spontaneous emission (ASE) emitted from the active layer 107. The VCSEL of the laser arrangement 100 is arranged to operate as a laser when receiving a drive current above laser threshold. The same VCSEL is in this embodiment further arranged to operate as optical filter (and amplifier) if a second drive current shortly below the laser threshold is provided. The first mirror 105 and the second mirror 109 may be grown such that both mirrors are characterized by the same reflectivity to improve the filter performance.

Figure 2:
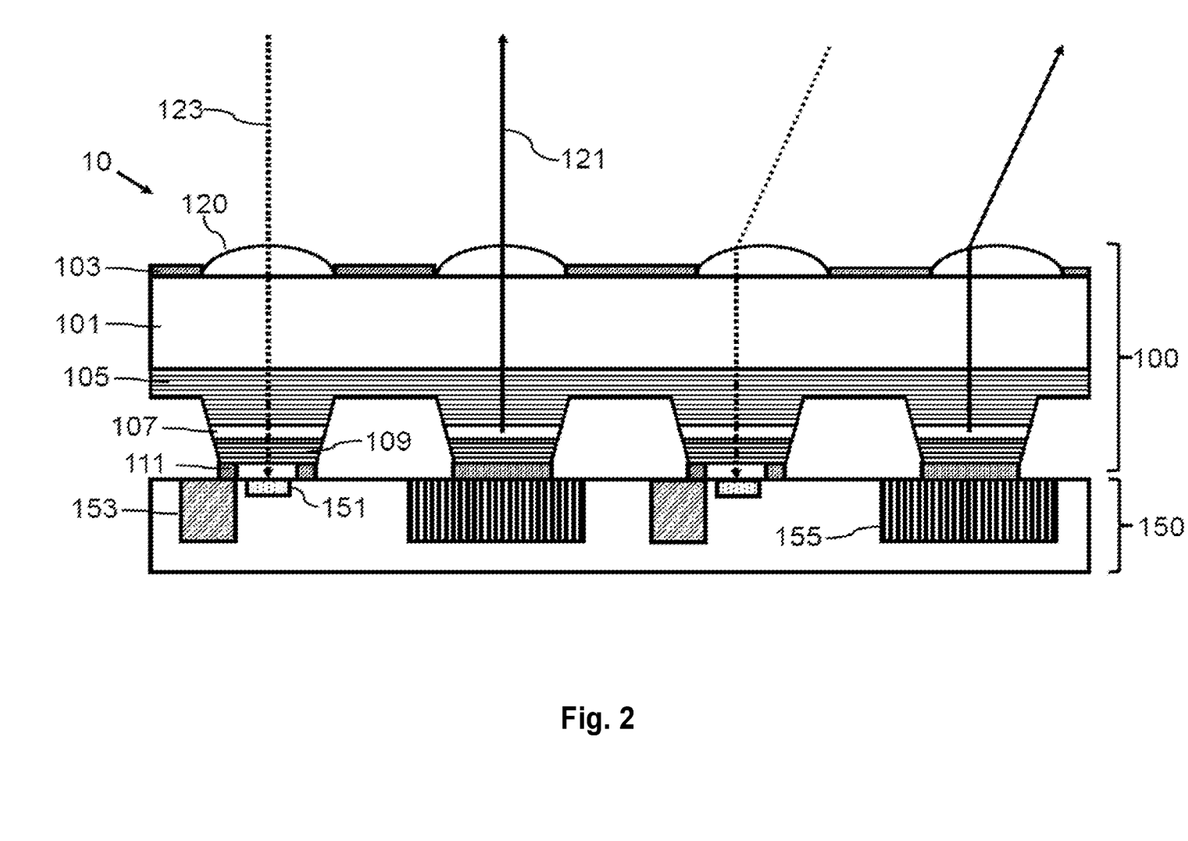
FIG. 2 shows a second detector arrangement.

FIG. 2 shows a principal sketch of a second detector arrangement 10. The second detector arrangement 10 comprises a laser arrangement 100, which is mounted on top of a carrier structure 150. The laser arrangement 100 comprises an array of VCSEL structures each comprising an optical resonator with a first mirror 105 (first DBR), a second mirror 109 (second DBR), and an active layer 107 sandwiched between the first DBR and the second DBR. Each VCSEL structure is arranged similar as the bottom emitting VCSEL described with respect to FIG. 1. The main difference is that there are two different kinds of VCSEL structures. First VCSEL structures are arranged to emit laser light 121 through substrate 101. The first VCSEL structures are therefore lasers. The second mirror 109 (second DBR) of these first VCSEL structures is completely covered by a second electrode 111. Second VCSEL structures are arranged to filter received light 123 comprising reflected laser light 121. The second VCSEL structures are therefore optical filters. The second mirror 109 (second DBR) of these second VCSEL structures is partly covered by an, e.g., ring shaped second electrical contact 111 such that filtered received light 123 can pass the second VCSEL structures through the opening in the second electrical contact 111. The first and the second VCSEL structures comprise a common first electrical contact 103. Openings in the first electrical contact 103 are aligned with the first and the second VCSEL structures in order to enable emission of laser light 121 and reception of received light 123. The laser arrangement 100 further comprises optical devices 120, wherein one optical device 120 (e.g. micro lens deposited on a surface of the substrate 101) is associated with one first or second VCSEL structure. The lasers are arranged to receive a first drive current by means of a second driver 155 comprised by the carrier structure 155 to emit laser light of a predetermined pulse length (especially very short pulses in the nanosecond range). The optical filters are arranged to receive a second drive current by means of a first driver 153 comprised by the carrier structure. The second drive current is arranged to increase transparency of the optical filters during reception of received light 123. The lasers and optical filters are in this embodiment arranged such that one laser is associated with one optical filter. The optical devices 120 which are associated with the laser and associated optical filter are arranged such that laser light 121 is emitted in a first direction and received light 123 is received by the associated optical filter from the same first direction. The optical devices 120 may, for example, be micro lenses, wherein a pair of micro lenses is associated with the laser and associated optical filter. The pairs of micro lenses may be slightly shifted with respect to each other in order to enable emission of laser light 121 and corresponding reception of received light 123 from a multitude of different directions. The carrier structure 150 further comprises optical sensors 151. The optical sensors 151 are aligned with the optical filters. Filtered and optionally amplified received laser light 121 is detected by means of the corresponding optical sensor 151. The second DBR of the optical filters may optionally be etched such that the first DBR and the second DBR of the optical filters are characterized by the same reflectivity to optimize filter properties.

Two or more optical filters may, in an alternative embodiment, be associated with one laser. Furthermore, two, three, four, or more lasers and associated optical filters may be arranged to emit laser light 121 in the same direction and receive light 123 from this direction such that the optical sensors 151 receive filtered reflected laser light 121 from this direction.

Figure 3:
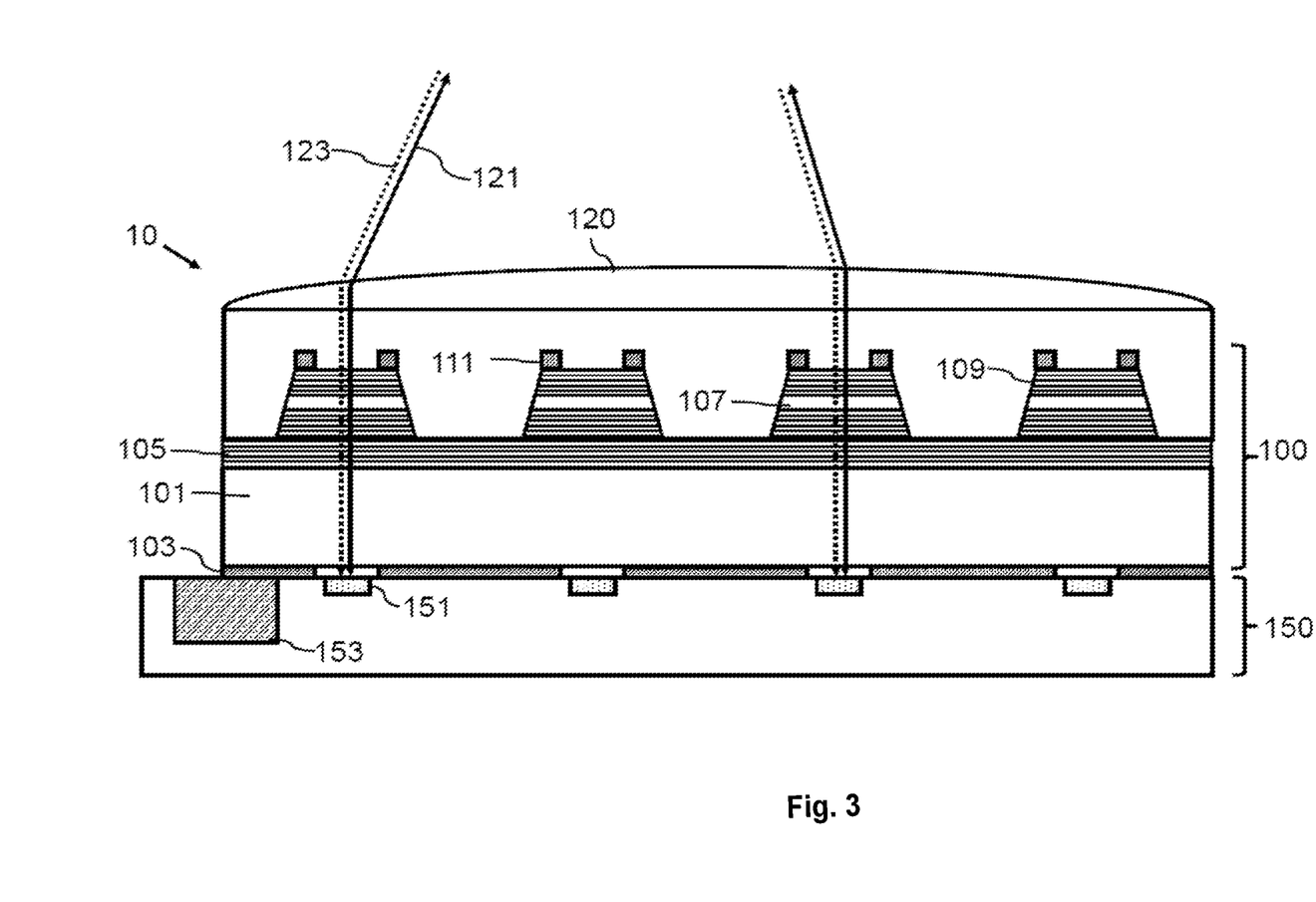
FIG. 3 shows a third detector arrangement.

FIG. 3 shows a principal sketch of a third detector arrangement 10 comprising a laser arrangement 100 and a carrier structure 150. The laser arrangement comprises an array of top emitting VCSELs each comprising a first mirror 105 a second mirror 109 and an active layer 107 arranged between the first mirror 105 and the second mirror 109. Reflectivity of the second mirror 109 is in this case somewhat lower than the reflectivity of the first mirror 105. Majority of the laser light 121 is therefore emitted through ring shaped second electrodes 111 which are arranged on top of the second mirror 109. A first electrode 103 is deposited on a backside of substrate 101 opposing the side of the substrate 101 on which the layer stacks of the first mirror 105 and subsequently the active layer 107, second mirror 109 and second electrode 111 are processed. The first electrode 103 comprises openings, which are aligned with the VCSEL such that laser light 121 can be emitted via the substrate 101 through the corresponding opening. Each of the top emitting VCSELs is arranged to operate as laser, and additionally as optical filter as described with respect to FIG. 1. The laser arrangement 100 is similar as discussed with respect to FIG. 2 mounted on the carrier structure 150 which comprises a first driver 153 arranged to provide the drive currents for the VCSELs (or VCSEL structures) by means of the first electrical contact 103 and the second electrical contact 111. The carrier structure 150 further comprises optical sensors 151, wherein the optical sensors are aligned with the openings of the first electrical contact 103. Driving of the VCSEL structures is performed in a similar way as described with respect to FIG. 1. A drive first current above laser threshold of the VCSEL structures is provided to enable emission of the laser pulse with predetermined pulse length. A second drive current below the laser threshold is provided in order to enable efficient filtering of the received light 123 comprising reflected laser light 121. The detector arrangement 10 further comprises one common optical device 120. The common optical device 120 is integrated on wafer level. A transparent material is deposited on top of the VCSEL structures such that essentially each VCSEL structure emits laser light 121 in one dedicated direction and receives received light 123 comprising reflected laser light 121 from this dedicated direction. The reflected laser light 121 received from this direction is filtered and optionally amplified by means of the same VCSEL structure emitting the laser light 121.

The substrate 101 and the first mirror 105 may optionally be etched such that the first mirror 105 and the second mirror 109 are characterized by the same reflectivity as discussed above.

Figure 4:
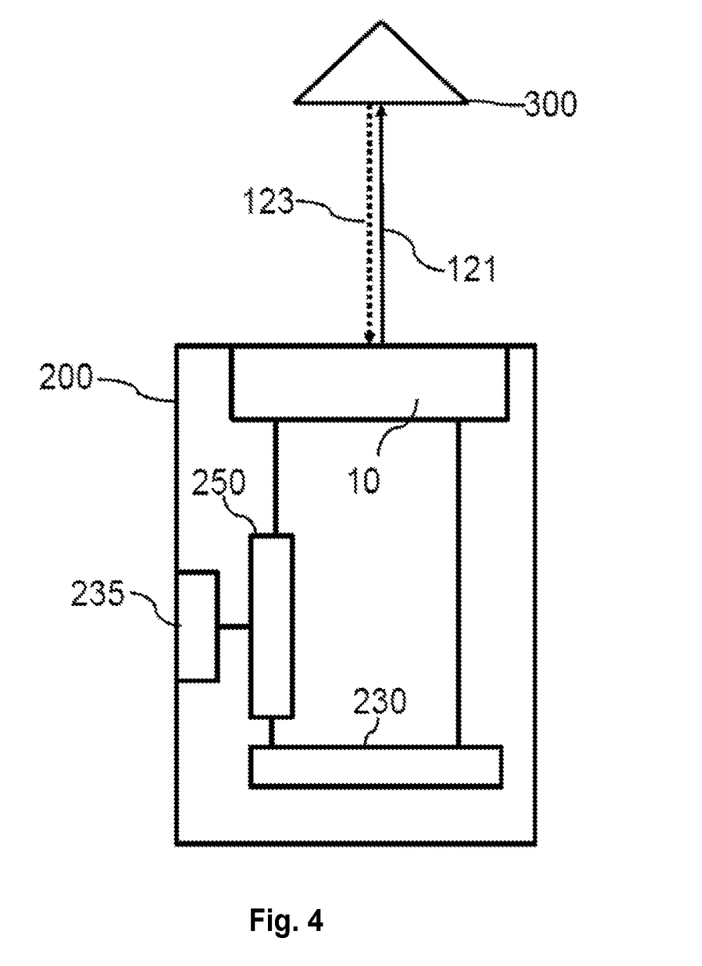
FIG. 4 shows a time-of-flight camera.

FIG. 4 shows a principal sketch of a time-of-flight camera 200. The time-of-flight camera 200 comprises a detector arrangement 10 in accordance with one of the embodiments discussed above. The detector arrangement 10 comprises an array of VCSEL structures operating as lasers and/or optical filters. The lasers are arranged to emit short laser pulses (laser light 121) hitting an object 300. A part of the laser light 121 is reflected by the object 300 such that received light 123 comprising reflected laser light 121 is received by the detector arrangement 10 and filtered by the optical filters in accordance with the emission direction of the corresponding laser light 121 as described above. The filtered reflected laser light 121 causes a corresponding electrical signal in a corresponding optical sensor of the detector arrangement 10 as discussed above. An electrical driver 230 may be arranged to electrically drive the VCSEL structures or optionally each VCSEL structure or sub-groups of VCSELs structures of the laser arrangement 100 separately. A controller 250 is connected with the electrical driver 230 to control, for example, start and stop time of the laser pulse emitted by lasers. The controller 250 is further connected with the optical sensors of the detector arrangement 10 to receive the electrical signals caused by the reflected laser light 121 detected by the optical sensors. The time-of-flight camera 200 further comprises an optional interface 235 to transfer start and stop time of the laser light 121 emitted by the corresponding lasers or group of lasers as well as time of reception of the electrical signal caused by the reflected laser light 121. The transferred data can be used to calculate the time-of-flight of the laser light 121 and therefore distances between the time-of-flight sensor module 200 and the object 300 for each direction in which laser light 121 is emitted. The time-of-flight sensor module 200 may alternatively comprise an evaluator electrically connected with the controller 250 (or may comprise or be comprised by controller 250) to determine the distances to the object. The controller may be further arranged to reconstruct a depth image of the object 300 based on the distance measurements by means of a corresponding reconstruction algorithm.

Preferably the epitaxial structure of the laser arrangements 10 discussed above (especially with respect to FIG. 1, FIG. 2 and FIG. 3) is optimized for high gain and amplification and high outcoupling, such that the laser only emits an ultra-short gain-switching peak of the laser light 121 for a high laser current. After the pulse is emitted, the current can be lowered or maybe even kept constant to stay in amplifying mode until the reflected laser light 121 comprised by the received light 123 will arrive back from the longest distance that should be measured. Then the current can be switched off while, for example, image processing is done, to reduce the amount of heat in the detector arrangement 100. This optimization for gain-switching can also be done by lowering the reflectivity of the high-reflectivity mirror as discussed above, which is quite unconventional compared to known VCSEL structures. Preferably the epitaxial structure is optimized on low absorption at the cost of higher electrical losses compared to known VCSELs or VCSEL structures, because currents in the application is usually low and pulsed. High resistance may be used to heat the optical filter with small currents, while the low optical losses allow a better amplification and transmission in the optical filter in order to enable optimized filtering and optionally amplification.

Figure 5:
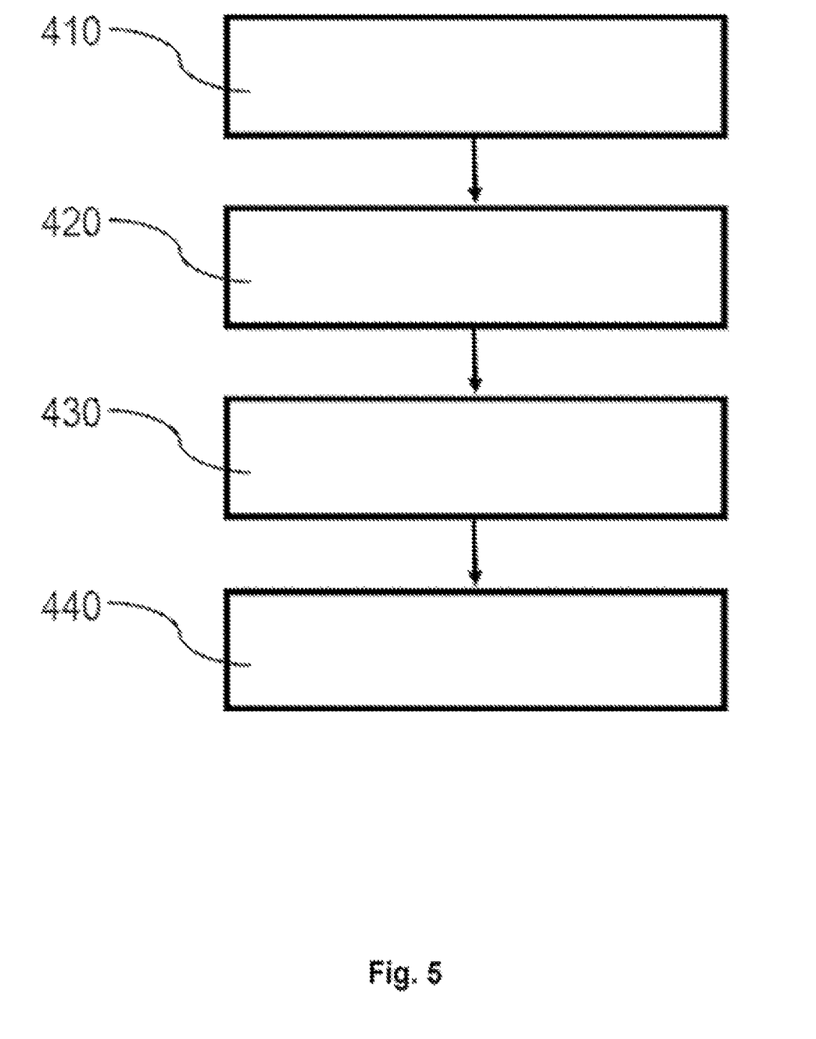
FIG. 5 shows a method of recording a depth image.

FIG. 5 shows a principal sketch of a method of recording a depth image of a scene. Laser light 121 is emitted in step 410 in a multitude of different directions. At least one laser emits laser light in at least one of the multitude of directions. Received light 123 comprising laser light 121 reflected by an object 300 in the scene for each of the multitude of directions is filtered in step 420 by means of at least one optical filter for each direction. At least one optical filter is associated with the at least one laser emitting laser light in the corresponding direction. Each optical filter comprises an optical passband in the wavelength range of the laser light for the corresponding direction. The filtered received light 123 is detected in step 430 by means of at least one optical sensor 151 for each optical filter. The distances to the object 300 are determined in step 440 by means of a time of emission of the laser light 121 and a time of detection of the corresponding filtered received light 123.

An embodiment of the present inventions uses the epitaxial structure first as laser and second as a selective optical filter having the exact same wavelength as the laser and a method to couple this to a separate array optical sensors 151 to form an ultra-compact light source and sun-light resistant detector array for a time-of-flight camera 200. Preferably a silicon chip (carrier structure 150) containing the array of optical sensors 151 contains a first driver 153 and optionally a second driver 155 for electrically driving the lasers and optionally to optimize filter transmission. The optical filter can be further optimized to function as an optical amplifier for the laser light 121 reflected back from the object 300 to be measured to increase the sensitivity. Preferably the semiconductor chip also contains optical devices 120 (especially wafer level integrated optical devices 120) to form a full ultra-flat integrated time-of-flight or 3D sensor.

While the present invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and

LIST OF REFERENCE NUMERALS 10 detector arrangement
100 laser arrangement
101 substrate
103 first electrical contact
105 first mirror
107 active layer
109 second mirror
111 second electrical contact
120 optical device
121 laser light
123 received light
130 spacer
150 carrier structure
151 optical sensor
153 first driver
155 second driver
200 time-of-flight camera
230 electrical driver
235 interface
250 controller
300 object
410 step of emitting laser light
420 step of filtering received light
430 step of detecting filtered received light
440 step of determining distances

The invention claimed is:

1. A laser arrangement for time-of-flight measurements, the laser arrangement comprising:
   at least one laser; and
   at least one optical filter,
   a first driver,
   wherein the at least one laser and the at least one optical filter each comprise:
      a substrate;
      a first mirror;
      a second mirror; and
      an active layer arranged between the first mirror and the second mirror,
   wherein the at least one laser is configured to emit laser light of an emission wavelength in a first direction,
   wherein the optical filter is configured to receive received light, the received light comprising the laser light emitted by the at least one laser and reflected from an object,
   wherein the laser light is configured to be emitted through the first mirror of the at least one laser,
   wherein the first mirror of the at least one optical filter is configured to receive the received light therethrough,
   wherein the first mirror of the at least one optical filter has a first reflectivity that is equal to a reflectivity of the first mirror of the at least one laser, the second mirror of the at least one optical filter has a second reflectivity that is equal to the reflectivity of the first mirror of the at least one laser, so that the optical filter is configured to filter the received light with an optimized transmission for a filter wavelength that is matched to the emission wavelength of the laser light emitted by the at least one laser and reflected from the object,
   wherein the substrate is a common substrate, the at least one laser and the at least one optical filter are arranged adjacent to each other on the common substrate, and wherein local heating to the at least one laser and the at least one optical filter are similar during operation of the laser arrangement, so that the filter wavelength remains matched to the emission wavelength in presence of a thermal shift,
   wherein the at least one laser has a first threshold current,
   wherein the at least one optical filter has a second threshold current higher than the first threshold current,
   wherein the first driver is configured to provide a first drive current to the at least one laser and the at least one optical filter, and
   wherein the first drive current is configured to be between the first threshold current and the second threshold current.

2. The laser arrangement according to claim 1, wherein the at least one laser is a Vertical Cavity Surface Emitting Laser.

3. The laser arrangement according to claim 1, wherein the laser arrangement further comprises at least a second laser, and at least a second optical filter,
   wherein each of the first laser and the second laser and each of the first optical filter and the second optical filter are optically coupled with an optical device,
   wherein the optical device is configured such that second laser light emitted by the second laser is emitted in a second direction different than the first direction,
   wherein the optical device is further configured to receive second received light, wherein the second received light comprises reflected second laser light emitted by the second laser, and wherein the second optical filter is further configured to filter the second received light such that the reflected second laser light emitted by the second laser and received from the second direction passes the second optical filter.

4. The laser arrangement according to claim 1, wherein the first reflectivity is about 99.5%.

5. The laser arrangement according to claim 1, wherein the second mirror of the at least one laser has a third reflectivity, and wherein each of the first reflectivity and the third reflectivity is between 95% and 99.5%.

6. A detector arrangement for time-of-flight measurements, the detector arrangement comprising:
   at least one laser;
   at least one optical filter;
   at least one carrier structure; and
   at least one first driver,
   wherein the at least one laser and the at least one optical filter comprise:
      a substrate;
      a first mirror;
      a second mirror; and
      an active layer arranged between the first mirror and the second mirror,
   wherein the at least one laser is configured to emit laser light of an emission wavelength in a first direction,
   wherein the optical filter is configured to receive received light, the received light comprising the laser light emitted by the at least one laser and reflected from an object,
   wherein the laser light is configured to be emitted through the first mirror of the at least one laser,
   wherein the first mirror of the at least one optical filter is configured to receive the received light therethrough,
   wherein the first mirror of the at least one optical filter has a first reflectivity that is equal to a reflectivity of the first mirror of the at least one laser, the second mirror of the at least one optical filter has a second reflectivity that is equal to the reflectivity of the first mirror of the at least one laser, so that the optical filter is configured to filter the received light with an optimized transmission for a filter wavelength that is matched to the emission wavelength of the laser light emitted by the at least one laser and reflected from the object,
   wherein the substrate is a common substrate, the at least one laser and the at least one optical filter are arranged adjacent to each other on the common substrate, and wherein local heating to the at least one laser and the at least one optical filter are similar during operation of the laser arrangement, so that the filter wavelength remains matched to the emission wavelength in presence of a thermal shift,
   wherein the object is configured to be in a predefined detection range,
   wherein the at least one laser and the at least one optical filter are attached to the carrier structure,
   wherein the carrier structure comprises at least one optical sensor,
   wherein the at least one optical sensor is configured to detect the received light filtered by the optical filter,
   wherein the first driver is configured to control the at least one laser such that the laser light of a predetermined pulse length is emitted,
   wherein the predetermined pulse length is shorter than 20 ns so that the pulse length is shorter than a time period for receiving the laser light reflected from the object in the predefined detection range,
   wherein the at least one laser has a first threshold current,
   wherein the at least one optical filter has a second threshold current higher than the first threshold current,
   wherein the first driver is configured to provide a first drive current to the at least one laser and the at least one optical filter, and
   wherein the first drive current is configured to be between the first threshold current and the second threshold current.

7. The detector arrangement according to claim 6, wherein the optical sensor is configured to provide a non-linear response upon detection of the received light.

8. The detector arrangement according to claim 6, wherein the at least one laser is a Vertical Cavity Surface Emitting Laser.

9. The detector arrangement according to claim 6, wherein the optical filter and the first drive current are configured to amplify the reflected laser light comprised by the received light received from the object.

10. The detector arrangement according to claim 6, wherein the first driver is arranged to provide the first drive current for the predetermined pulse length, and wherein the first driver is configured to provide the first drive current to the at least one optical filter during detection of the laser light reflected from the object in the predefined detection range.

11. The detector arrangement according to claim 6, wherein the detector arrangement further comprises at least a second laser and at least a second optical filter, wherein each of the first laser and the second laser and each of the first optical filter and the second optical filter is optically coupled with an optical device, wherein the optical device is configured such that second laser light emitted by the second laser is emitted in a second direction different than the first direction, wherein the optical device is further configured to receive second received light, wherein the second received light comprises reflected second laser light emitted by the second laser, and wherein the second optical filter is further configured to filter the second received light such that the reflected second laser light emitted by the second laser and received from the second direction passes the second optical filter.

12. A time-of-flight camera comprising the detector arrangement according to claim 6, the time-of-flight camera further comprising an evaluator configured to determine a distance to the object according to the detection of the received light.

13. A method of recording a depth image of a scene using a time-of-flight camera according to claim 12, the method comprising:
   emitting laser light in a multitude of different directions, wherein at least one laser emits at least part of the laser light in at least one of the multitude of directions;
   filtering received light comprising the laser light reflected by an object in the scene for each of the multitude of directions using at least one optical filter for each of the directions,
   wherein the at least one optical filter respectively for one of the directions is associated with the at least one laser emitting the laser light in the corresponding direction, wherein for each of the directions the at least one optical filter comprises an optical passband in a wavelength range of the laser light for the corresponding direction;

detecting the filtered received light by at least one optical sensor associated with the at least one optical filter for each of the directions; and determining at least one distance to the object using a time of emission of the laser light and a time of detection of the filtered received light.

14. A non-transitory computer readable medium comprising processor executable instructions, which when executed by one or more processors of the time-of-flight camera, cause the time-of-flight camera to perform the method according to claim 13.

15. The detector arrangement according to claim 6, wherein the first reflectivity is about 99.5%.

16. The detector arrangement according to claim 6, wherein the second mirror of the at least one laser has a third reflectivity, and wherein each of the first reflectivity and the third reflectivity is between 95% and 99.5%.

* * * * *